United States Patent
Lien et al.

(10) Patent No.: US 6,204,557 B1
(45) Date of Patent: Mar. 20, 2001

(54) REDUCTION OF TOPSIDE MOVEMENT DURING TEMPERATURE CYCLES

(75) Inventors: Chuen-Der Lien, Los Altos Hills; Chun-Ya Chen; Pauli Hsueh, both of San Jose; Ta-Ke Tien, Cupertino; Leonard Perham, Monte Sereno, all of CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/394,667

(22) Filed: Sep. 13, 1999

(51) Int. Cl.[7] .................................................. H01L 23/48
(52) U.S. Cl. ........................... 257/734; 257/620; 257/700
(58) Field of Search .................................. 257/734, 620, 257/776, 700, 619, 670

(56) References Cited

U.S. PATENT DOCUMENTS

| | | |
|---|---|---|
| 4,364,078 | 12/1982 | Smith et al. . |
| 5,043,793 | 8/1991 | Gootzen et al. . |
| 5,266,832 | 11/1993 | Yamamoto et al. . |
| 5,317,186 | 5/1994 | Wills et al. . |
| 5,583,370 | 12/1996 | Higgins, III et al. . |
| 5,650,666 | 7/1997 | Hartranft et al. . |
| 5,831,330 | * 11/1998 | Chang ................................... 257/620 |
| 5,834,829 | * 11/1998 | Dinkel et al. ......................... 257/620 |
| 5,973,387 | * 10/1999 | Chen et al. ........................... 257/620 |

* cited by examiner

Primary Examiner—Roy Potter
(74) Attorney, Agent, or Firm—Bever Hoffman & Harms, LLP (57) ABSTRACT

An integrated circuit structure that includes a patterned uppermost conductive layer having a current-carrying trace. The current-carrying trace is connected to an underlying substrate by a multi-layer interconnect structure. The current-carrying trace, which is located around the outer edges of the integrated circuit structure, has at least one edge exhibiting a serpentine pattern. A topside film is located over the patterned uppermost conductive layer, wherein the topside film exhibits an increased thickness adjacent to the serpentine pattern. The increased thickness of the serpentine pattern results in a relatively strong topside film structure near the edges of the substrate. As a result, the portions of the topside film located over inner traces of the uppermost conductive layer are protected from excessive forces during thermal cycling.

20 Claims, 8 Drawing Sheets

REDUCTION OF TOPSIDE MOVEMENT DURING TEMPERATURE CYCLES

BACKGROUND OF THE INVENTION

1. Field of the Invention

The present invention relates to the backend processing of integrated circuits. More specifically, the present invention relates to the processing of a topside film of an integrated circuit.

2. Discussion of Related Art

In general, an integrated circuit die has a topside film that is located over an uppermost metal layer. The purpose of the topside film is to protect the uppermost metal layer from damage. Typically, the topside film is a composite film that includes silicon oxide and silicon nitride.

Figure 1:
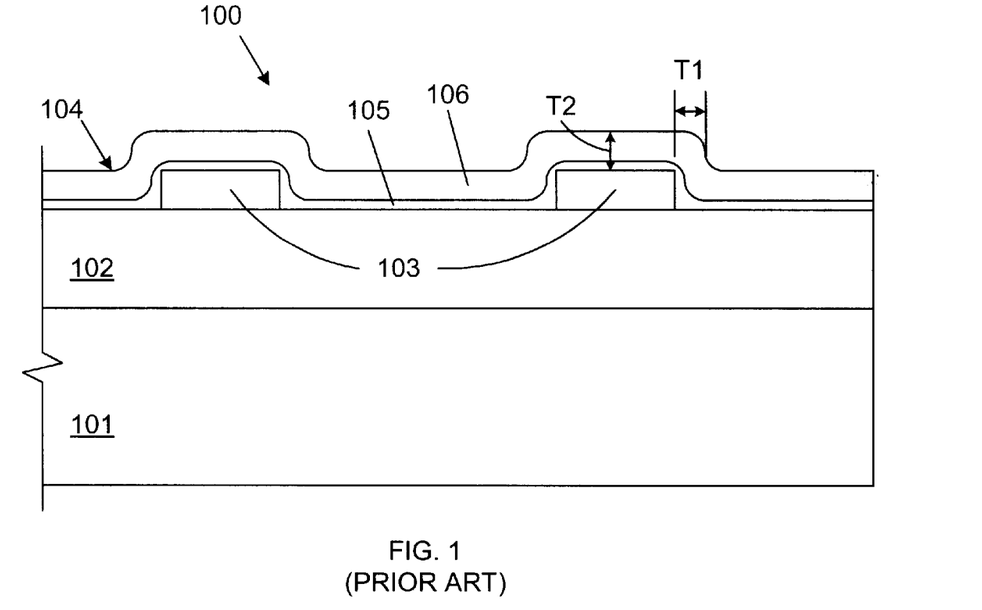
FIG. 1 is a cross sectional diagram of a conventional integrated circuit die having a topside film located over an uppermost metal layer.

FIG. 1 is a cross sectional diagram of an upper portion of an integrated circuit die 100 that includes silicon substrate 101, intermediate interconnect structure 102, uppermost metal layer 103 and topside film 104. Intermediate interconnect structure 102 includes a plurality of conductive layers, insulating layers and contacts which are configured to route signals to and from circuit elements fabricated in substrate 101. Topside film 104 is located over uppermost metal layer 103. Topside film 104 includes a layer of silicon oxide 105 and an overlying layer of silicon nitride 106. Silicon oxide layer 105 has a thickness on the order of 2000 Angstroms, and silicon nitride layer 106 has a thickness on the order of 8000 Angstroms. Topside film 104 exhibits a first thickness T1 on the sides of uppermost metal layer 103, and a second thickness T2 over the top of uppermost metal layer 103. The first thickness T1 is thinner than the second thickness T2. For example, thickness T1 is typically about 70 percent of thickness T2.

Figure 2:
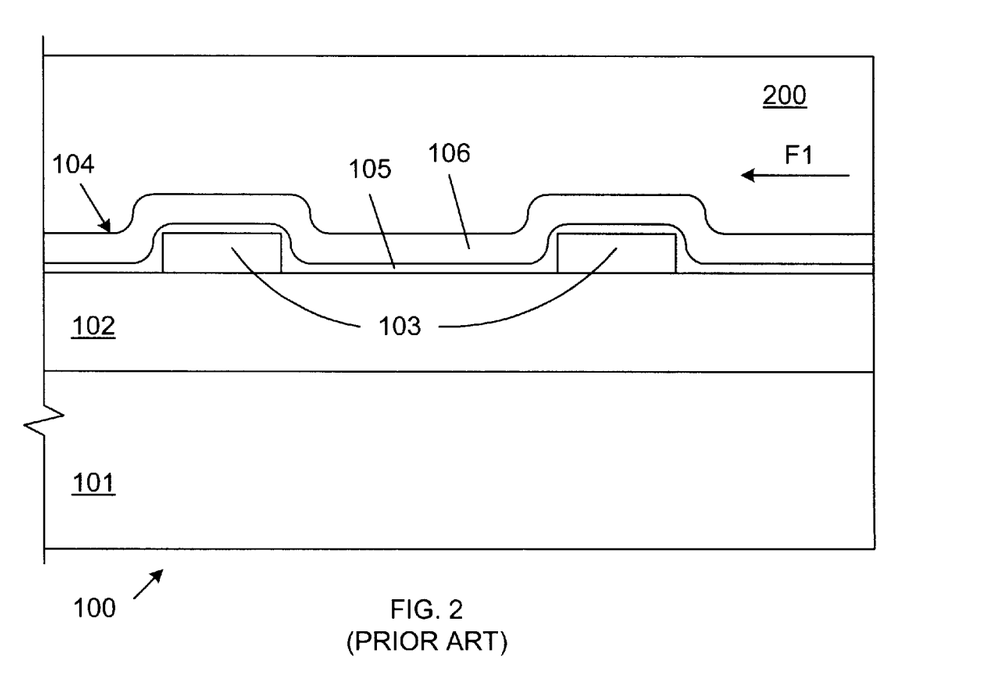
FIG. 2 is a cross sectional diagram of the die of FIG. 1, with a plastic molding compound formed over the topside film.
Figure 3:
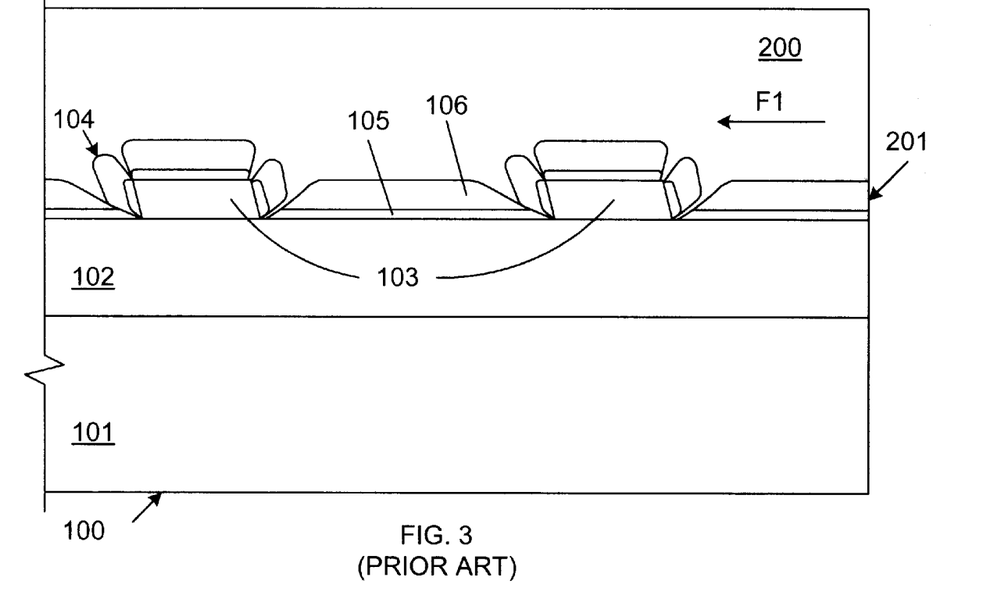
FIG. 3 is a cross sectional diagram illustrating damage to the topside film of the die of FIG. 1 caused by thermal cycling.

As illustrated in FIG. 2, when die 100 is put in a plastic package, plastic molding compound 200 covers the entire upper surface of die 100. At this point, temperature cycling is commonly used to test the strength of topside film 104. Temperature cycling refers to the process of cycling the packaged die between a low temperature (e.g., −65° C.) and a high temperature (e.g., 150° C.). Due to the different thermal expansion coefficients of plastic molding compound 200 and silicon substrate 101, the molding compound 200 will apply a force on topside film 104. This force is directed radially inward toward the center of die 100 at low temperatures, as indicated by arrow F1. If topside film 104 is not strong enough, topside film 104 will break around the sides of uppermost metal layer 103 as shown in FIG. 3. The force exerted by molding compound 200 is greatest near the outer edge 201 of die 100.

Solutions have been proposed to increase the strength of the topside film at the edges of the uppermost metal layer. One conventional solution is to form sidewall spacers on the sides of the uppermost metal layer prior to forming the topside film.

Figure 4:
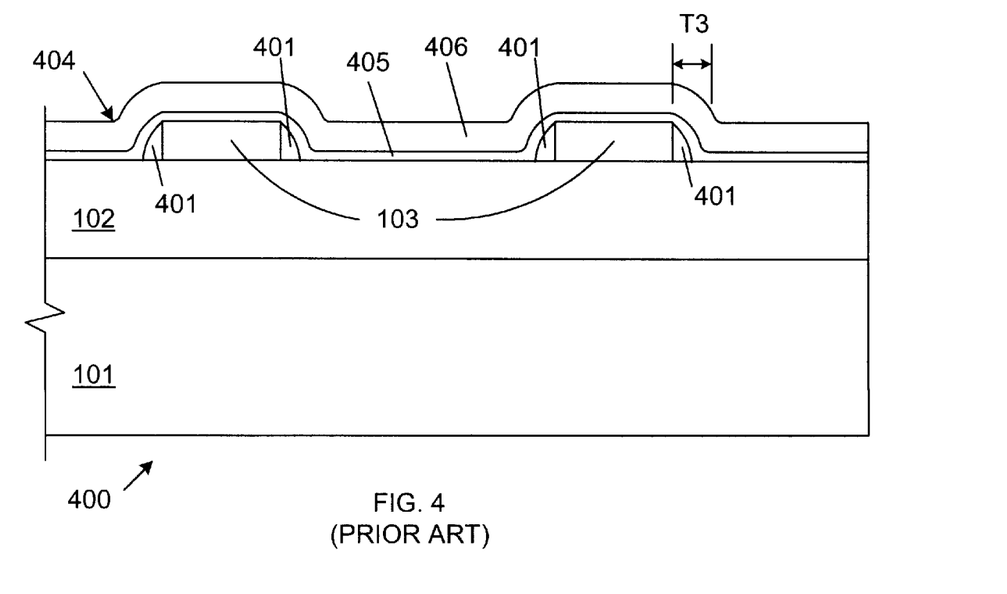
FIG. 4 is a cross sectional diagram of a conventional integrated circuit die having a topside film located over an uppermost metal layer with sidewall spacers.

FIG. 4 is a cross sectional view of a die 400 that includes oxide spacers 401 formed on the sides of uppermost metal layer 103. Because die 400 (FIG. 4) is similar to die 100 (FIG. 1), similar elements in FIGS. 1 and 4 are labeled with similar reference numbers. Silicon oxide layer 405 and silicon nitride layer 406 are formed over uppermost metal layer 103 and sidewall spacers 401. The resulting topside film 404 has a thickness T3 on the sides of uppermost metal layer 103 that is significantly greater than the thickness T1 on the sides of uppermost metal layer 103 (FIG. 1). As a result, topside film 404 is stronger than topside film 104 (FIG. 1). However, the formation of sidewall spacers 401 significantly increases the complexity of the process used to create die 400.

It would therefore be desirable to have a method and structure for increasing the width, and therefore the strength, of the topside film on the sides of an uppermost metal layer without increasing process complexity.

SUMMARY

Accordingly, the present invention provides an integrated circuit structure that includes a patterned uppermost conductive layer having a current-carrying trace. The current-carrying trace is connected to an underlying substrate by a multi-layer interconnect structure. The current-carrying trace, which is located around the outer edges of the integrated circuit structure, has at least one edge exhibiting a serpentine pattern. A topside film is located over the patterned uppermost conductive layer, wherein the topside film exhibits an increased thickness adjacent to the serpentine pattern. The increased thickness of the serpentine pattern results in a relatively strong topside film structure near the edges of the substrate. This strong topside film structure protects the topside film located over inner traces of the uppermost conductive layer during thermal cycling.

In one embodiment, the current-carrying trace is coupled to receive a $V_{SS}$ (ground) supply voltage. In another embodiment, the current-carrying trace is coupled to receive a $V_{CC}$ supply voltage.

In one variation, the patterned uppermost conductive layer further includes a surrounding trace located adjacent to an outer edge of the current-carrying trace. A serpentine gap is formed between the outer edge of the current-carrying trace, and the inner edge of the surrounding trace. In this variation, a portion of the topside film is located in the serpentine gap, thereby forming a serpentine wall of topside film. The serpentine wall can have different shapes. For example, the serpentine wall can exhibit outer angles of 120 degrees, thereby providing a honeycomb pattern to the serpentine wall. In this embodiment, the serpentine wall has a substantially uniform thickness along the axis of force applied during thermal cycling. In another embodiment, the serpentine wall has outer angles measuring about 90 degrees.

In accordance with another aspect of the invention, a plurality of openings are located through the current-carrying trace, whereby pillars of topside film are formed through the openings. The openings can have various shapes, including square. The patterned uppermost conductive layer can further include a plurality of traces located at corners of the substrate. A relatively rigid topside structure is provided around these traces.

In accordance with another embodiment of the present invention, the uppermost conductive layer additionally includes a second current-carrying trace located within the current-carrying trace. The second current-carrying trace has at least one edge with a serpentine pattern. The multi-layer interconnect structure provides a plurality of direct connections between the second current-carrying trace and selected circuit elements fabricated on the substrate.

The present invention will be more fully understood in view of the following description and drawings.

DETAILED DESCRIPTION

Figure 5:
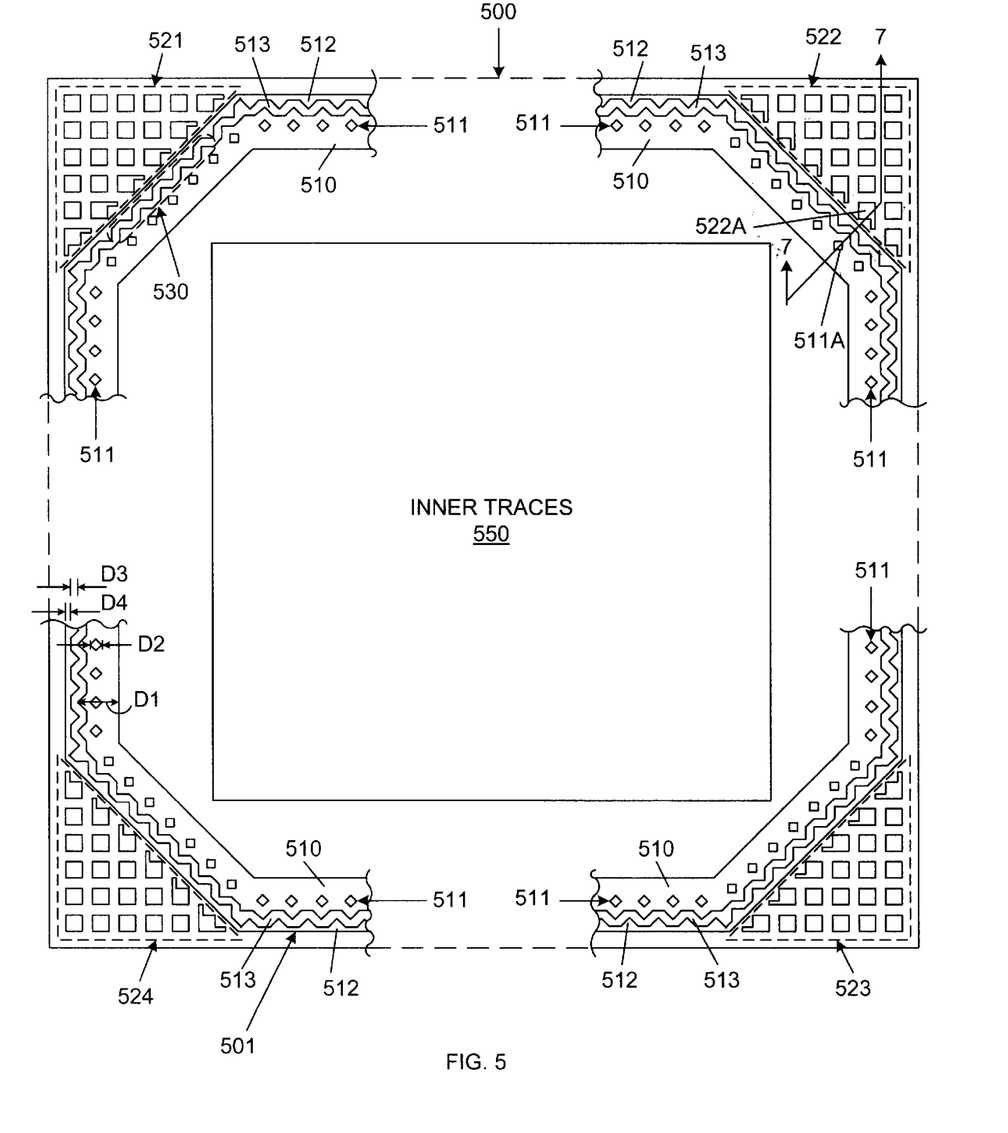
FIG. 5 is a top view of an uppermost conductive layer of a die in accordance with one embodiment of the present invention.

FIG. 5 is a top view of an uppermost conductive layer 501 of a die 500 in accordance with one embodiment of the present invention. Uppermost conductive layer 501 includes current-carrying trace 510, surrounding trace 512, corner trace patterns 521–524, and inner traces 550. In general, inner traces 550 include a plurality of traces used to carry signals to and from elements (e.g., transistors, diodes, resistors) fabricated on die 500. As described in more detail below, current-carrying trace 510, surrounding trace 512, and corner trace patterns 521–524 are patterned to prevent damage to uppermost conductive layer 501 during thermal cycling.

In the described embodiment, uppermost conductive layer 501 is made of a patterned metal, such as aluminum or an aluminum alloy. The metal used in uppermost conductive layer 501 is typically softer than a subsequently deposited topside film.

In the described embodiment, current-carrying trace 510 is a continuous trace that extends around the periphery of die 500. In other embodiments, current-carrying trace 510 can be discontinuous. In the described embodiment, current-carrying trace 510 has a dimension D1 that measures about 9 microns. A plurality of openings 511 are formed in current-carrying trace 510. In the described embodiment, openings 511 are evenly spaced apart along trace 510. In the described embodiment, each of openings 511 is square, with a corner of the square pointing towards the inner edge of trace 510. Each of square openings has a dimension D2 that measures about 3 microns. However, openings 511 can have other shapes and sizes in other embodiments. As described in more detail below, a topside film is subsequently deposited into openings 511, thereby forming pillars of topside material in openings 511.

Figure 6:
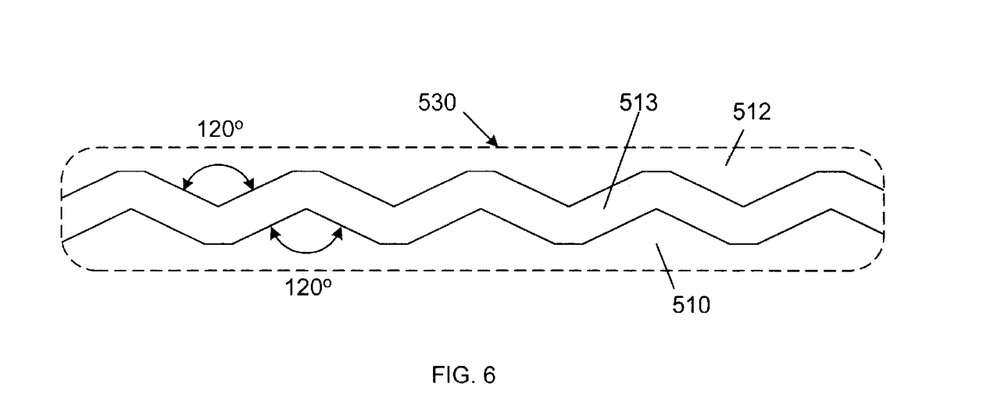
FIG. 6 is an enlarged view of a serpentine gap formed in the uppermost conductive layer of FIG. 5.

In the described embodiment, trace 512 is a continuous trace that laterally surrounds current-carrying trace 510. In other embodiments, surrounding trace 512 can be discontinuous. In the described embodiment, trace 512 has dimensions D3 and D4 that each measure about 2 microns. The outer edge of trace 510 and the inner edge of trace 512 are patterned such that a serpentine gap 513 exists between current-carrying trace 510 and surrounding trace 512. Area 530 of serpentine gap 513 is shown in enlarged detail in FIG. 6. In this embodiment, the main exterior angles of serpentine gap 513 measure 120 degrees. This angle corresponds with the interior angle of a regular hexagon (or honeycomb pattern). As described in more detail below, a topside film is deposited in serpentine gap 513, thereby forming a wall of topside material having a serpentine (or honeycomb) pattern. The 120 degree angle selected for serpentine gap 513 provides a maximum stiffness in this wall of topside material. In the described embodiment, serpentine gap 513 has a width of about 2 microns.

In general, current-carrying trace 510 and surrounding trace 512 extend along the edges of die 500. However, at the corners of die 500, traces 510 and 512 form 45 degree angles with respect to the edges of die 500. This configuration maintains a substantially perpendicular orientation between traces 510 and 512 and the radial axes that extend from the center of die 500 to the edges of die 500. More specifically, this configuration advantageously maintains a perpendicular orientation between the wall of topside material formed in serpentine gap 513 and radial forces that are subsequently asserted by a plastic molding compound during thermal cycling.

Corner trace patterns 521–524 are located in the corners of die 500, outside of traces 510 and 512. Each of corner trace patterns 521–524 includes a plurality of square traces arranged in a grid-like configuration within a triangular area. In the described embodiment, the square traces have dimensions of about 5 microns by 5 microns.

Figure 7:
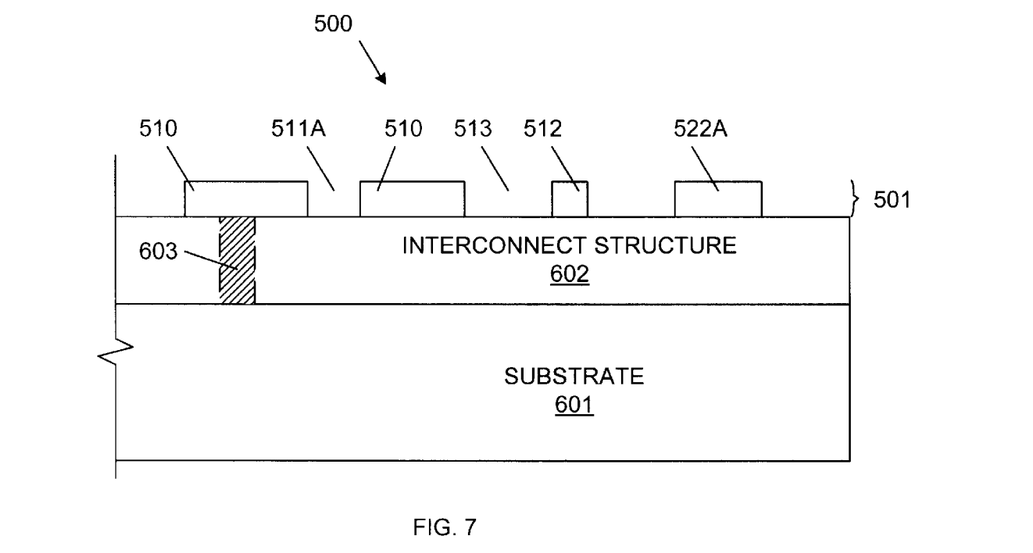
FIG. 7 is a cross sectional view of the die of FIG. 5 along section line 7—7.

FIG. 7 is a cross sectional view of die 500 along section line 7—7 of FIG. 5. As illustrated in FIG. 7, die 500 includes semiconductor substrate 601, multi-layer intermediate interconnect structure 602, and uppermost conductive layer 501. In the described embodiment, substrate 601 is monocrystalline silicon. Multi-layer intermediate structure 602 is a conventional structure that typically includes one or more layers of patterned, conductively-doped polycrystalline silicon and one or more layers of patterned metal, with intervening insulating layers. Conductive elements (i.e., via plugs or contacts) extend through the insulating layers at predetermined locations to connect the patterned metal layers to one another, and to circuit elements fabricated in substrate 601. Current-carrying trace 510 is coupled to underlying substrate 601 by a conductive pathway 603 formed in multi-layer intermediate structure 602. During operation of die 500, current-carrying trace 510 is coupled to receive a $V_{SS}$ (ground) supply voltage. Current-carrying trace 510 thereby forms a $V_{SS}$ voltage supply bus that provides the $V_{SS}$ supply voltage to substrate 601.

In an alternate embodiment, current carrying trace 510 can be configured to form a $V_{CC}$ voltage supply bus, which provides a positive (or negative) $V_{CC}$ supply voltage to circuit elements fabricated on substrate 601.

A topside film is formed over uppermost conductive layer 501 as follows. First, a layer of silicon oxide is deposited over conductive layer 501. In the described example, this silicon oxide layer has a thickness on the order of 2000 Angstroms. Then, a layer of silicon nitride is deposited over the silicon oxide layer. In the described embodiment, this silicon nitride layer has a thickness on the order of 8000 Angstroms.

Figure 8:
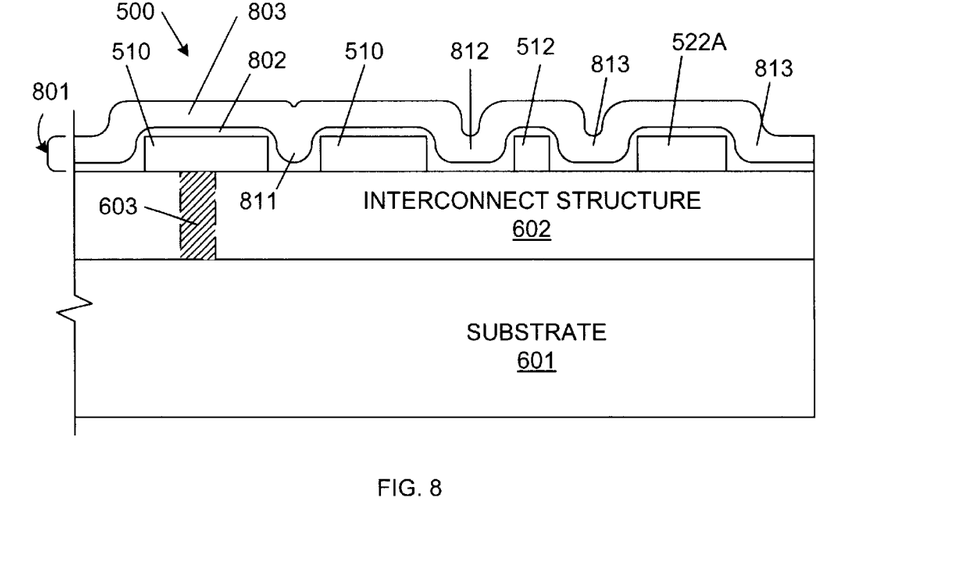
FIG. 8 is a cross sectional diagram of a topside film formed over the structure of FIG. 7.

FIG. 8 is a cross sectional diagram of a topside film 801 formed over the structure of FIG. 7. Topside film 801 includes silicon oxide layer 802 and silicon nitride layer 803.

As illustrated in FIG. 8, topside film 801 extends into openings 511, such as opening 511A (FIG. 7) thereby forming a plurality of topside pillars, such as pillar 811. These pillars extend around the periphery of die 500, through current-carrying trace 510. These pillars provide a rigid structure that buffers forces applied during thermal cycling. Openings 511 are sized such that topside film 801 substantially fills these openings to form the pillars. In one embodiment, openings 511 have a dimension D2 of 3 microns.

Topside film 801 also extends into serpentine gap 513, (FIG. 7) thereby forming a topside wall 812 between conductive traces 510 and 512. This topside wall 812 provides a structure that buffers radial forces that are applied during thermal cycling. The honeycomb structure of topside wall 812 advantageously maximizes the rigidity of the resulting structure.

Figure 9:
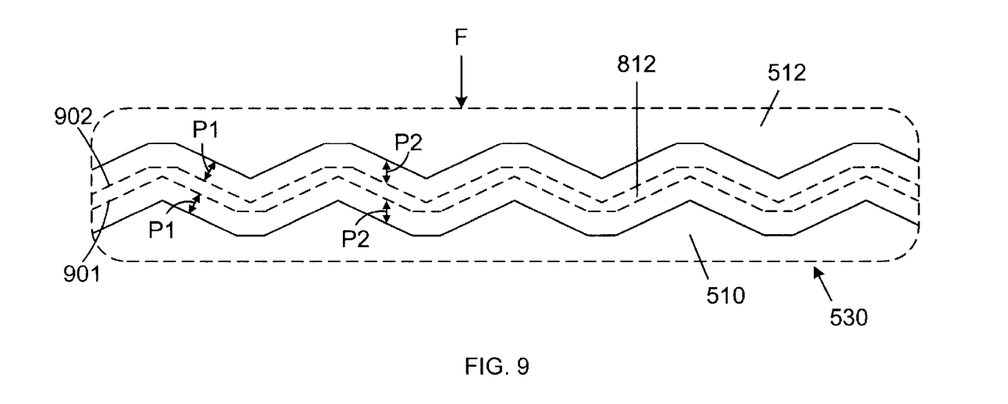
FIG. 9 is an enlarged view of a serpentine wall of topside material formed in the serpentine gap of FIG. 6.

In general, the shape of the uppermost conductive layer 501 is controlled to maximize the effective width, and therefore strength, of topside film 801 on the sides of uppermost conductive layer 501, without increasing process complexity. FIG. 9 is an enlarged view of area 530 of die 500, including topside wall 812, after topside film 801 has been fabricated. Dashed line 901 illustrates the width of topside film 801 adjacent to the outer edge of trace 510. Similarly, dashed line 902 illustrates the width of topside film 801 adjacent to the inner edge of trace 512. Dashed line 901 is spaced apart from the outer edge of trace 510 by a distance P1, which is measured at an angle perpendicular to the outer edge of trace 510. Similarly, dashed line 902 is spaced apart from the inner edge of trace 512 by the distance P1, which is measured at an angle perpendicular to the inner edge of trace 512. During thermal cycling, forces are applied to topside film along the axis F, which is generally perpendicular to traces 510 and 512. The topside film 801 adjacent to the outer edge of trace 510 and the inner edge of trace 512 has an effective width P2 along axis F. In the described embodiment, effective width P2 is greater than width P1. As a result, the effective width of topside film 801 adjacent to traces 510 and 512 is advantageously increased without increasing process complexity.

Topside film 801 also extends into the spaces between corner trace patterns 521–524, thereby forming topside grid structures, such as topside grid structure 813 (FIG. 8). These grid structures provide additional buffering near the corners of die 500.

Figure 10:
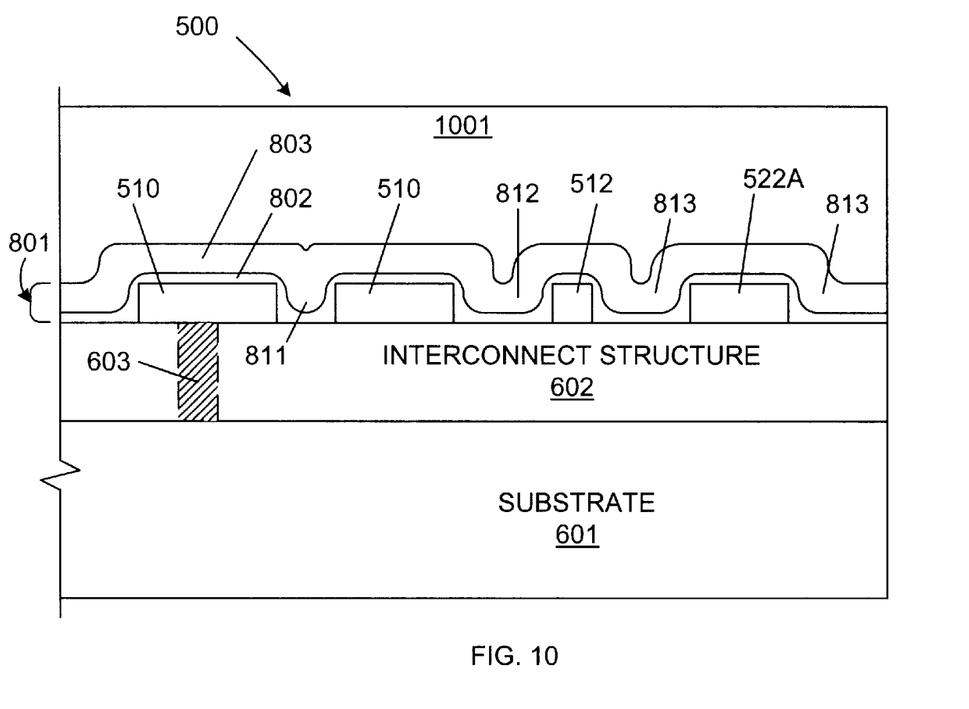
FIG. 10 is a cross sectional diagram of a plastic molding compound formed over the structure of FIG. 8.

As illustrated in FIG. 10, a plastic molding compound 1001 is formed over topside film 801, thereby encapsulating die 500. During thermal cycling, plastic molding compound 1001 expands and contracts, thereby exerting inward and outward forces along the radial axes of die 500. Topside pillars 811, topside wall 812 and topside grid structures 813 absorb substantially all of the radial forces exerted by the expanding and contracting molding material 1001. As a result, the portion of topside film 801 located over inner traces 550 (FIG. 5) is protected during thermal cycling.

Figure 11:
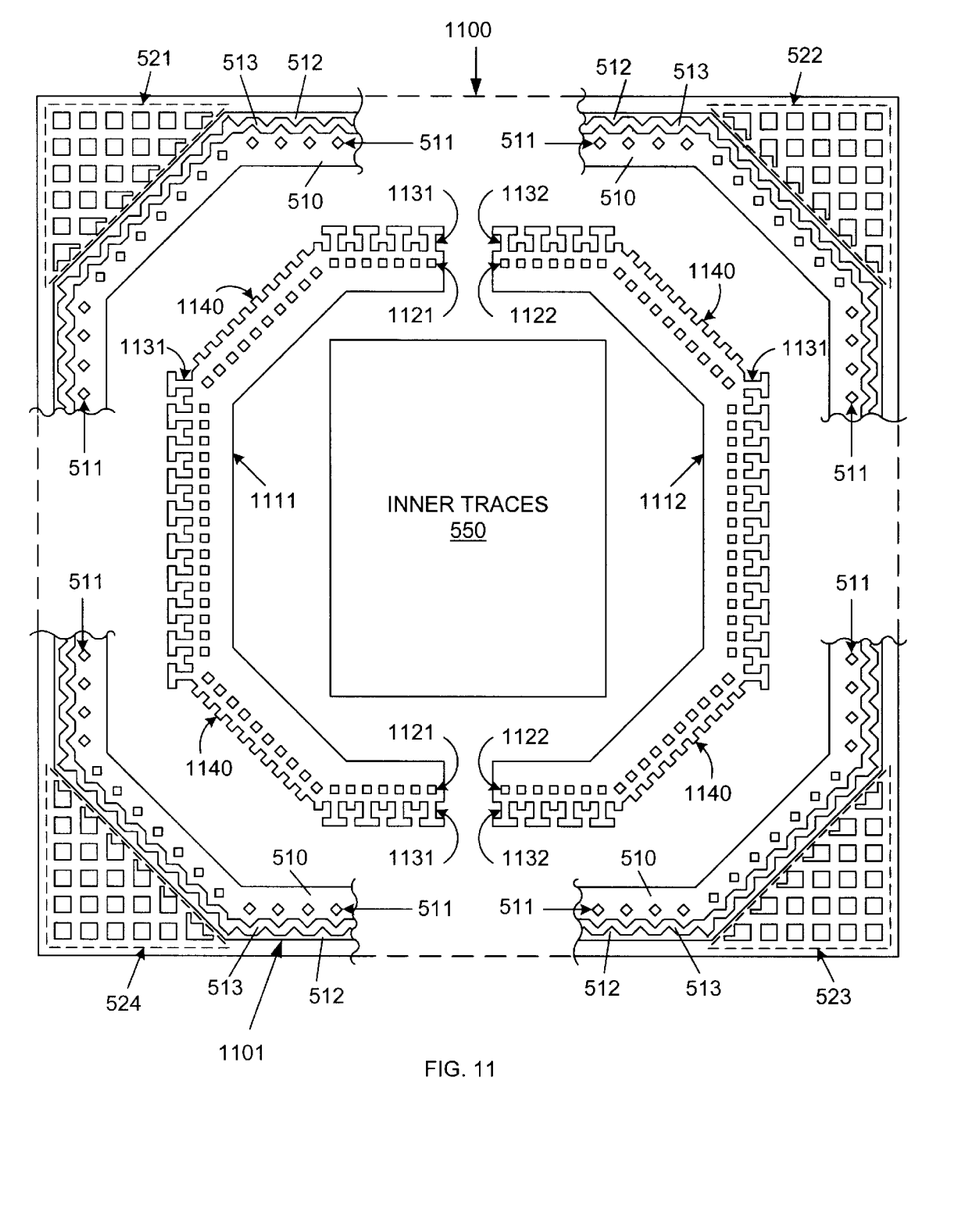
FIG. 11 is a top view of an uppermost conductive layer of a die in accordance with another embodiment of the present invention.

FIG. 11 is a top view of an uppermost conductive layer 1101 of a die 1100 in accordance with another embodiment of the present invention. Because die 1100 (FIG. 11) is similar to die 500 (FIG. 5), similar elements in FIGS. 5 and 11 are labeled with similar reference numbers. Thus, die 1100 includes the above-described elements of die 500. In addition, the uppermost conductive layer of die 1100 includes current-carrying traces 1111 and 1112, which are designed to carry a positive (or negative) $V_{CC}$ supply voltage to circuit elements fabricated in the underlying substrate. Thus, each of current-carrying traces 1111 and 1112 is coupled to an external $V_{CC}$ voltage supply source. Current-carrying traces 1111 and 1112 are connected to the desired circuit elements in an underlying substrate through conductive paths in a multi-layer interconnect structure. Although traces 1111 and 1112 are separate traces in the described embodiment, these traces can be joined to form a single conductive trace in other embodiments.

Openings 1121 and 1122 are located in current-carrying traces 1111 and 1112, respectively. A plurality of openings 1121 and 1122 are formed in traces 1111 and 1112, respectively. In the described embodiment, openings 1121 and 1122 are evenly spaced apart along traces 1111 and 1112, respectively. In the described embodiment, each of openings 1121 and 1122 is square. However, these openings 1121 and 1122 can have other shapes in other embodiments. When a topside film is deposited over the uppermost conductive layer 1101, topside pillars are formed in openings 1121 and 1122.

Like traces 510 and 512, traces 1111 and 1112 are configured to be aligned with the edges of die 1100, except near the corners of die 1100. Near the corners of die 1100, traces 1111 and 1112 exhibit a 45 degree angle with respect to the edges of die 1100. Thus, traces 1111 and 1112 are advantageously arranged to be substantially perpendicular to the radial axes of die 1100.

Figure 12A:
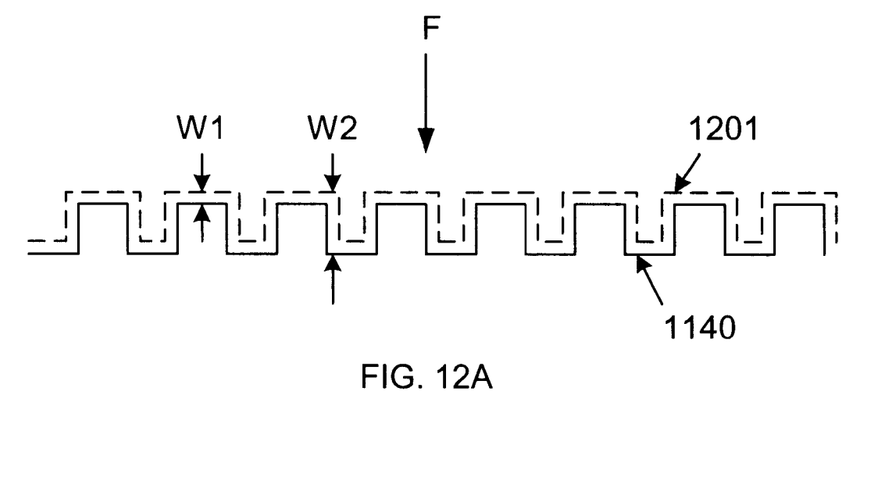
FIG. 12A is an enlarged view of a first portion of a serpentine pattern, with a dashed line illustrating the width of a subsequently deposited topside film adjacent to the pattern.

The outer edges of traces 1111 and 1112 exhibit a serpentine pattern 1140 near the corners of die 1100. FIG. 12A is an enlarged view of a portion of serpentine pattern 1140, along with a dashed line 1201 illustrating the width of a subsequently deposited topside film adjacent to pattern 1140. In certain locations, the topside film has a relatively small width W1 along the axis F (the axis of applied force during thermal cycling). However, in other locations, the topside film has a relatively large width W2 along the axis F. This serpentine pattern 1140 thereby increases the average effective width of the topside film adjacent to pattern 1140. However, because serpentine pattern 1140 does not increase the effective width of the topside film along the entire pattern, the results achieved by the serpentine pattern of traces 510 and 512 are generally superior to the results achieved by serpentine pattern 1140.

Figure 12B:
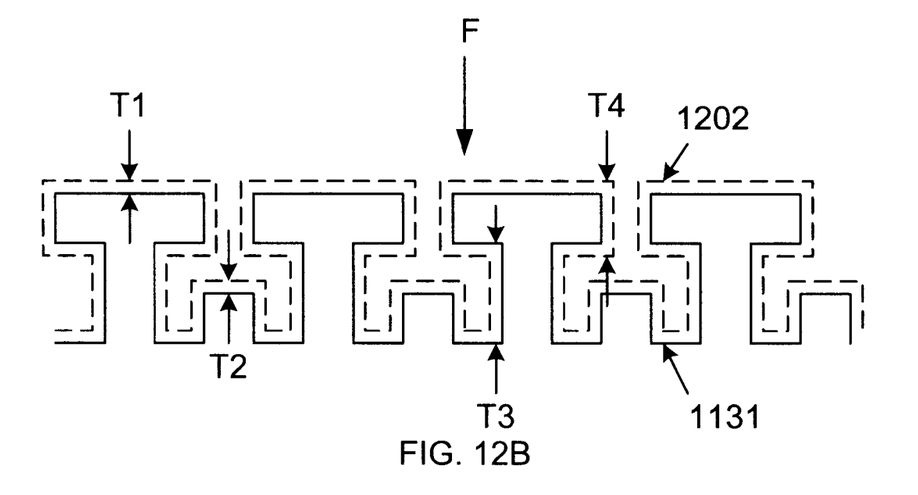
FIG. 12B is an enlarged view of a second portion of a serpentine pattern, with a dashed line illustrating the width of a subsequently deposited topside film adjacent to the pattern.

The outer edges of traces 1111 and 1112 exhibit a modified serpentine pattern 1131–1132 near the edges of die 1100. FIG. 12B is an enlarged view of a portion of serpentine pattern 1131, along with a dashed line 1202 illustrating the width of a subsequently deposited topside film adjacent to pattern 1131. In certain locations, the topside film has a relatively small widths T1, T2 along the axis F (the axis of applied force during thermal cycling). However, in other locations, the topside film has a relatively large widths T3, T4 along the axis F. The modified serpentine pattern 1131 thereby increases the average effective width of the topside film adjacent to pattern 1131. However, because serpentine pattern 1131 does not increase the effective width of the topside film along the entire pattern, the results achieved by the serpentine pattern of traces 510 and 512 are generally superior to the results achieved by serpentine pattern 1131.

Although the present invention has been described in connection with several embodiments, it is understood that this invention is not limited to the embodiments disclosed, but is capable of various modifications which would be apparent to one of ordinary skill in the art. Thus, the invention is limited only by the following claims.

What is claimed is:

1. An integrated circuit structure comprising:
   a semiconductor substrate having circuit elements fabricated thereon;
   a multi-layer interconnect structure located over the substrate, wherein the multi-layer interconnect structure includes a patterned uppermost conductive layer having a current-carrying trace coupled to the substrate by the multi-layer interconnect structure, the current-carrying trace being located around edges of the substrate, wherein the current-carrying trace has at least one edge exhibiting a serpentine pattern; and
   an insulating layer located over the patterned uppermost conductive layer, wherein the insulating layer exhibits an increased thickness adjacent to the serpentine pattern in a direction of a radial axis of the integrated circuit structure as compared to the thickness adjacent to the serpentine pattern in a direction perpendicular to the at least one edge.

2. The structure of claim 1, wherein the multi-layer interconnect structure provides at least one direct connection between the current-carrying trace and the substrate.

3. The structure of claim 2, wherein the multi-layer interconnect structure provides a plurality of connections between the current-carrying trace and the substrate.

4. The structure of claim 1, wherein the patterned uppermost conductive layer further comprises a surrounding trace located adjacent to an outer edge of the current-carrying trace.

5. The structure of claim 4, wherein a serpentine gap is formed between the outer edge of the current-carrying trace, and an inner edge of the surrounding trace.

6. The structure of claim 5, wherein a portion of the insulating layer is located in the serpentine gap, thereby forming a serpentine wall of insulating material.

7. The structure of claim 6, wherein the serpentine wall has a substantially uniform thickness along an axis perpendicular to the current-carrying trace.

8. The structure of claim 5, wherein the serpentine gap has outer angles measuring about 120 degrees.

9. The structure of claim 5, wherein the serpentine gap has outer angles measuring about 90 degrees.

10. The structure of claim 1, wherein an outer edge of the current-carrying trace has outer angles measuring about 120 degrees.

11. The structure of claim 1, wherein an outer edge of the current-carrying trace has outer angles measuring about 90 degrees.

12. The structure of claim 1, wherein an outer edge of the current-carrying trace has a plurality of "T" shaped patterns.

13. The structure of claim 1, wherein the insulating layer comprises a layer of silicon oxide and a layer of silicon nitride.

14. The structure of claim 1, wherein a plurality of openings are located through the current-carrying trace, whereby pillars of the insulating layer are formed through the openings.

15. The structure of claim 14, wherein the openings are square.

16. The structure of claim 1, wherein the patterned uppermost conductive layer further comprises a plurality of traces located at corners of the substrate.

17. The structure of claim 1, wherein the uppermost conductive layer further comprises a plurality of inner traces that are located inside the current-carrying trace.

18. The structure of claim 1, further comprising a molding compound formed over the insulating layer.

19. The structure of claim 1, wherein the uppermost conductive layer further comprises a second current-carrying trace located within the current-carrying trace, wherein there are a plurality of direct connections through the multi-layer interconnect structure between the second current-carrying trace and the circuit elements.

20. The structure of claim 1, wherein the current-carrying trace exhibits 45 degree angles with respect to corners of the substrate.

* * * * *